(12) United States Patent
Gupta

(10) Patent No.: US 6,654,940 B2
(45) Date of Patent: Nov. 25, 2003

(54) METHOD AND APPARATUS FOR IMPROVING CRITICAL PATH ANALYSIS USING GATE DELAY

(75) Inventor: Abhay Gupta, San Jose, CA (US)

(73) Assignee: Sun Microsystems, Inc, Santa Clara, CA (US)

( * ) Notice: Subject to any disclaimer, the term of this patent is extended or adjusted under 35 U.S.C. 154(b) by 82 days.

(21) Appl. No.: 10/062,591

(22) Filed: Jan. 31, 2002

(65) Prior Publication Data

US 2003/0145295 A1 Jul. 31, 2003

(51) Int. Cl.$^7$ ................................................ G06F 17/50
(52) U.S. Cl. ........................................................... 716/6
(58) Field of Search .................................. 716/1, 4, 6

(56) References Cited

U.S. PATENT DOCUMENTS 5,282,148 A * 1/1994 Poirot et al. .................... 716/6

* cited by examiner

*Primary Examiner*—Matthew Smith
*Assistant Examiner*—Thuan Do
(74) *Attorney, Agent, or Firm*—Blakely Sokoloff Taylor & Zafman, LLP

(57) ABSTRACT

Disclosed are novel methods and apparatus for efficiently providing critical path analysis of a design. In an embodiment, an apparatus disclosed can assist in creating a single critical path schematic which can be used to simulate both rising and falling edge delays. This saves time as only one schematic and one simulation is required instead of the two generally required.

33 Claims, 5 Drawing Sheets

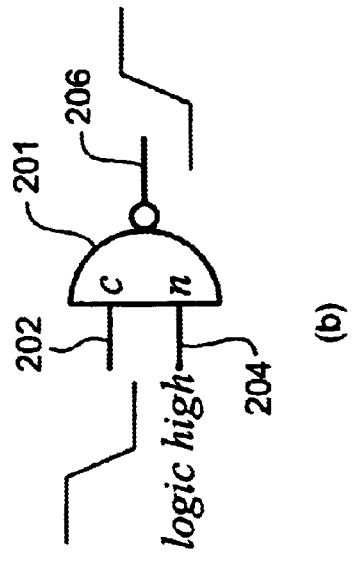
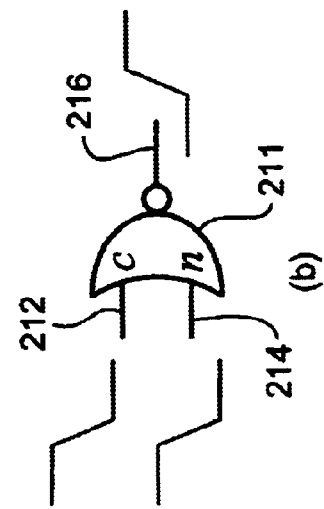
FIG. 2A
FIG. 2B
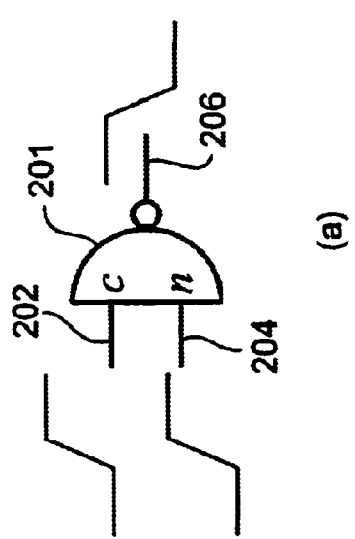
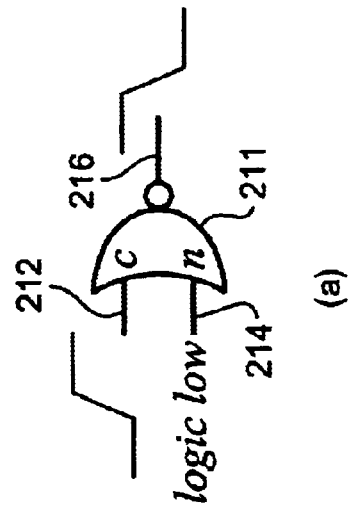

METHOD AND APPARATUS FOR IMPROVING CRITICAL PATH ANALYSIS USING GATE DELAY

FIELD OF INVENTION

The subject of this application relates generally to the field of integrated circuit (IC) design and, more particularly, to reducing critical path schematics apparatus and methods.

BACKGROUND OF INVENTION

Critical path analysis is one of the most important stages of circuit design, in part, because it can help determine the speed at which a circuit may be run. As circuits are quickly becoming more complicated, critical path analysis, as with many other circuit analysis techniques, is becoming increasingly computerized for efficiency purposes.

Also, as circuits grow in complexity (sometimes reaching thousands and sometimes millions of gates), it is imperative to decrease the number of computer resources and hours spent on evaluating these designs. This is extremely important with respect to critical path analysis. Especially, in the current climate of competition, it is imperative that the speed of a circuit be determined before investing substantial amounts of money on making and marketing a device that may be dwarfed by solutions from competitors.

Accordingly, critical path analysis is not only a tool for engineers to determine if their circuit design works, but also a tool for a marketing and finance division of a company to determine whether a given circuit design is worthy of pursuing.

Generally, circuit designers use a software program, such as HSpice provided by Avant Corporation of Fremont, Calif., to simulate the critical path schematics for their designs. Since the logic gates have different delays through them for rising and falling output nodes, the critical path of a circuit would have to be simulated for both rising and falling edges of a final output node. This requires creating at least two different schematics and simulations to calculate these delays.

After running these simulations, the higher of the rising or falling delays represents the worst-case delay. And, the worst-case delay in turn defines the final delay of the circuit. The final delay indicates the maximum frequency at which a design may safely run. Accordingly, it is important to set up these simulations carefully and efficiently.

SUMMARY OF INVENTION

The present invention, which may be used/set up on a general-purpose digital computer, includes methods and apparatus to provide efficient critical path analysis of a design, utilizing single or multiple processors.

In an embodiment, the techniques described herein disclose two devices that can be used to simulate both rising and falling delays through gates in a critical path using only one schematic and, hence, one simulation.

In another embodiment, an apparatus disclosed may assist in creating a single critical path schematic which can be used to simulate both rising and falling edge delays. This saves time as only one schematic and, hence, one simulation is required instead of the two generally required.

In yet a different embodiment, a method of efficiently performing critical path analysis is disclosed. The method includes providing a device to assist in determining both rising and falling delays for the critical path analysis of a gate; coupling an input of the device to a controlling input of the gate; coupling an output of the device to a non-controlling input of the gate, the device having an I/O characteristic wherein: signals at both the input and output of the device rise and fall substantially simultaneously on a first edge; and on a remaining edge, a signal at the device output follows one of a rise and a fall of a signal at the device input after a output node delay; and determining the rising and falling delays for the critical path analysis of the gate utilizing the device.

BRIEF DESCRIPTION OF DRAWINGS

The present invention may be better understood and it's numerous objects, features, and advantages made apparent to those skilled in the art by reference to the accompanying drawings in which:

FIG. 2A illustrates an exemplary configuration of input settings for determining rising and falling delays through a NAND gate;

FIG. 2B illustrates an exemplary configuration of input settings for determining rising and falling delays through a NOR gate;

FIG. 3A(*b*) illustrates exemplary I/O characteristics of the system 300 of FIG. 3A(*a*) in accordance with an embodiment of the present invention;

FIG. 3B(*b*) illustrates exemplary I/O characteristics of the system 350 of FIG. 3B(*a*) in accordance with an embodiment of the present invention;

The use of the same reference symbols in different drawings indicates similar identical items.

DETAILED DESCRIPTION

In the following description, numerous details are set forth. It will be apparent, however, to one skilled in the art, that the present invention may be practiced these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
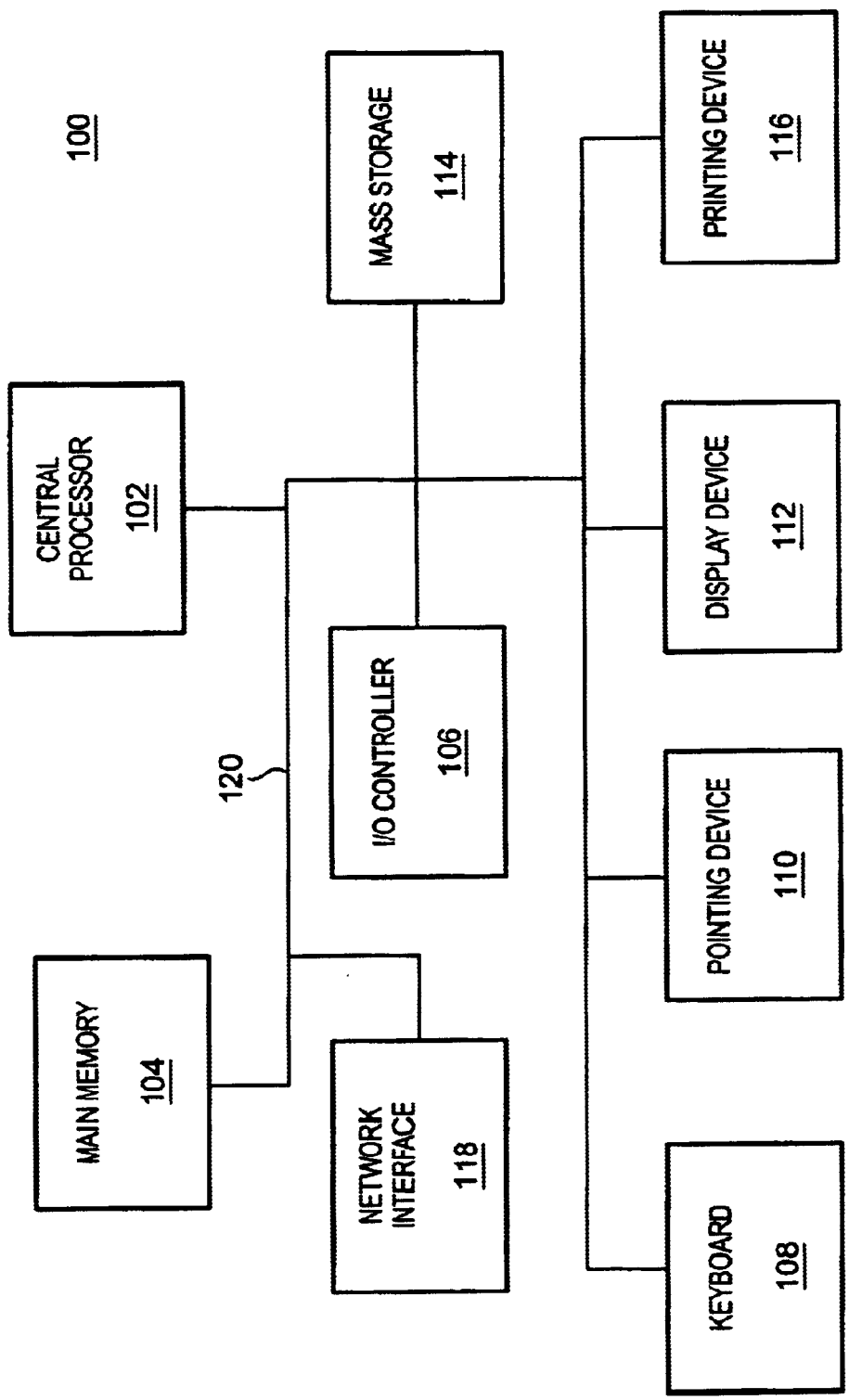
FIG. 1 illustrates an exemplary computer system 100 in which the present invention may be embodied.

FIG. 1 illustrates an exemplary computer system 100 in which the present invention may be embodied in certain embodiments. The system 100 comprises a central processor 102, a main memory 104, an input/output (I/O) controller 106, a keyboard 108, a pointing device 110 (e.g., mouse, track ball, pen device, or the like), a display device 112, a mass storage 114 (e.g., hard disk, optical drive, or the like), and a network interface 118. Additional input/output devices, such as a printing device 116, may be included in the system 100 as desired. As illustrated, the various components of the system 100 communicate through a system bus 120 or similar architecture.

In an embodiment, the computer system 100 includes a Sun Microsystems computer utilizing a SPARC microprocessor available from several vendors (including Sun Microsystems of Palo Alto, Calif.). Those with ordinary skill in the art understand, however, that any type of computer system may be utilized to embody the present invention, including those made by Hewlett Packard of Palo Alto, Calif., and IBM-compatible personal computers utilizing Intel microprocessor, which are available from several vendors (including IBM of Armonk, N.Y.). Also, instead of a single processor, two or more processors (whether on a single chip or on separate chips) can be utilized to provide speedup in operations.

The network interface 118 provides communication capability with other computer systems on a same local network, on a different network connected via modems and the like to the present network, or to other computers across the Internet. In various embodiments, the network interface 118 can be implemented in Ethernet, Fast Ethernet, wide-area network (WAN), leased line (such as T1, T3, optical carrier 3 (OC3), and the like), digital subscriber line (DSL and its varieties such as high bit-rate DSL (HDSL), integrated services digital network DSL (IDSL), and the like), time division multiplexing (TDM), asynchronous transfer mode (ATM), satellite, cable modem, and FireWire.

Moreover, the computer system 100 may utilize operating systems such as Solaris, Windows (and its varieties such as NT, 2000, XP, ME, and the like), HP-UX, Unix, Berkeley software distribution (BSD) Unix, Linux, Apple Unix (AUX), and the like. Also, it is envisioned that in certain embodiments, the computer system 100 is a general purpose computer capable of running any number of applications such as those available from companies including Oracle, Siebel, Unisys, Microsoft, and the like.

FIG. 2A illustrates an exemplary configuration of input settings for determining rising and falling delays through a NAND gate 201. Generally, the input settings for determining the rising and falling delays through a logic gate are different.

In the figures, the controlling input of each gate is marked with a "c" and the non-controlling input is marked with an "n" symbol. The gate delay is normally evaluated from the controlling input to the output. However, specific combinations may be given at the non-controlling input to evaluate the worst-case delay through the gate.

In case of a NAND gate (illustrated in FIG. 2A), if there is a rising edge on a controlling input 202, a substantially simultaneous rising edge is present at a non-controlling input 204 to obtain the worst-case falling delay at an output 206 (FIG. 2A(*a*)). If there is a falling edge at the controlling input 202, the non-controlling input 204 is kept at a logic high level to obtain the worst-case rising delay at the output 206 (FIG. 2A(*b*)).

FIG. 2B illustrates an exemplary configuration of input settings for determining rising and falling delays through a NOR gate 211. NAND and NOR gates are appropriate choices as examples because they are the most basic of the gates that need different input settings for simulating rise and fall delays through them. Other examples of such gates include.

In case of a NOR gate (illustrated in FIG. 2B), if there is a falling edge on a controlling input 212, a substantially simultaneous falling edge is present at a non-controlling input 214 to obtain the worst-case rising delay at an output 216 (FIG. 2B(*b*)). If there is a rising edge at the controlling input 212, the non-controlling input 214 is kept at a logic low level to obtain the worst-case falling delay at the output 216 (FIG. 2B(*a*)).

Figure 3A:
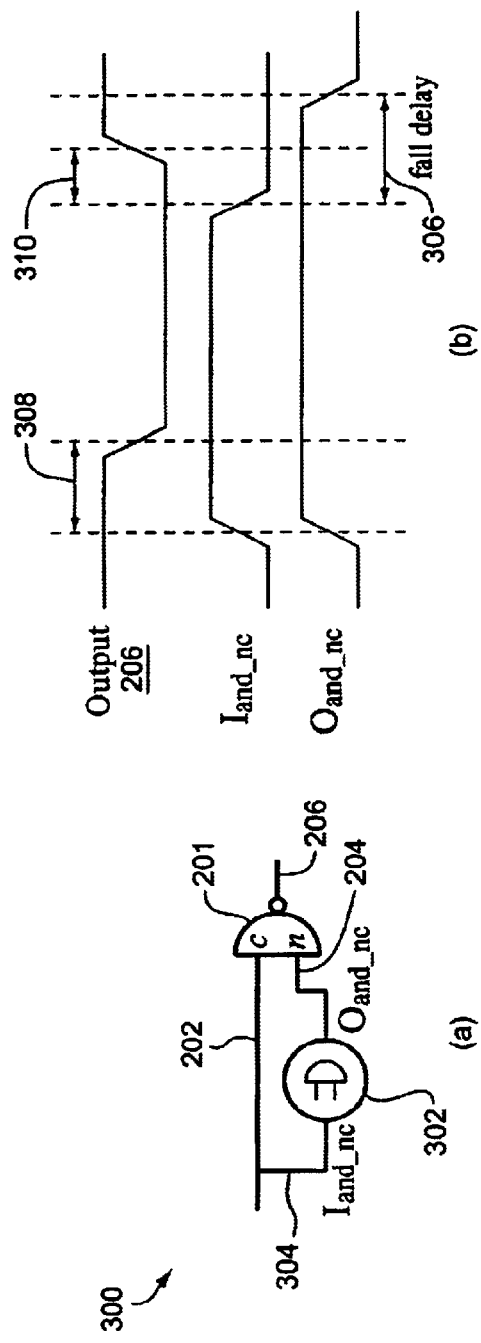
FIG. 3A(*a*) illustrates an exemplary system 300 utilizing a AND_NC gate 302 in accordance with an embodiment of the present invention.

FIG. 3A(*a*) illustrates an exemplary system 300 utilizing a AND_NC gate 302 in accordance with an embodiment of the present invention. FIG. 3A(*b*) illustrates exemplary characteristics of the system 300 of FIG. 3A(*a*) in accordance with an embodiment of the present invention.

In FIG. 3A(*a*), the system 300 includes the NAND gate 201 and the AND_NC gate 302. As illustrated, the AND_NC gate 302 receives the controlling input 202 as $I_{and\_nc}$ 304 and provides its output $O_{and\_nc}$ to the non-controlling input 204 of the NAND gate 201.

In FIG. 3A(*b*), $I_{and\_nc}$, $O_{and\_nc}$, and output 206 characteristics are shown. As illustrated, both $I_{and\_nc}$ and $O_{and\_nc}$ signals have a substantially simultaneous rise. As these signals rise (see, e.g., the left half of FIG. 3A(*b*)), the output 206 will fall after an output falling delay 308 (see also FIG. 2A(*a*)). Once $I_{and\_nc}$ falls, the output 206 will rise after an output rising delay 310 (see also FIG. 2A(*b*)). Accordingly, the system 300 of FIG. 3A(*a*) can determine both the rising and falling output delays for the NAND gate 201. Also indicated is a non-controlling fall input delay 306 between the time $I_{and\_nc}$ falls and when $O_{and\_nc}$ falls (see, e.g., the right half of FIG. 3A(*b*)). It is envisioned that the fall delay 306 be selected such that it is sufficiently longer than the output rising delay 310. Otherwise, if the $O_{and\_nc}$ signal falls prior to the output 206 rising, the rising output delay for the output 206 may not be accurately determined.

Figure 3B:
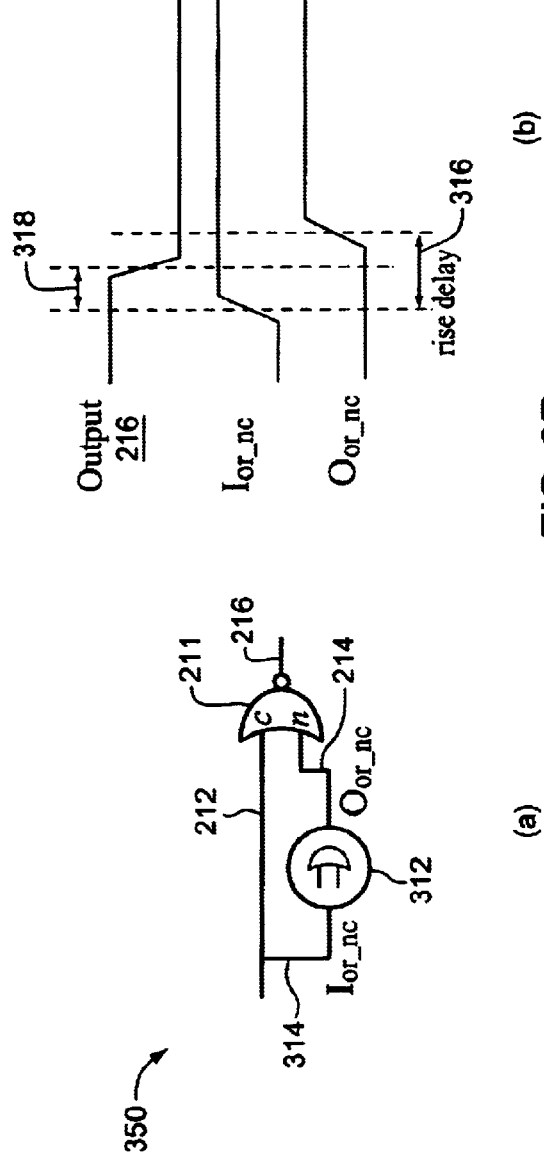
FIG. 3B(*a*) illustrates an exemplary system 350 utilizing an OR_NC gate 312 in accordance with an embodiment of the present invention.

FIG. 3B(*a*) illustrates an exemplary system 350 utilizing an OR_NC gate 312 in accordance with an embodiment of the present invention. FIG. 3B(*b*) illustrates exemplary characteristics of the system 350 of FIG. 3B(*a*) in accordance with an embodiment of the present invention.

In FIG. 3B(*a*), the system 350 includes the NOR gate 211 and the OR_NC gate 312. As illustrated, the OR_NC gate 312 receives the controlling input 212 as $I_{or\_nc}$ 314 and provides its output $O_{or\_nc}$ to the non-controlling input 214 of the NOR gate 211.

In FIG. 3B(*b*), $I_{or\_nc}$, $O_{or\_nc}$, and output 216 characteristics are shown. As illustrated, both $I_{or\_nc}$ and $O_{or\_nc}$ signals have a substantially simultaneous fall. As these signals fall (see, e.g., the right half of FIG. 3B(*b*)), the output 216 will rise after an output rising delay 320 (see also FIG. 2A(*b*)).

Once $I_{or\_nc}$ rises, the output 216 will fall after an output falling delay 318 (see also FIG. 2A(*a*)). Accordingly, the system 300 of FIG. 3B(*a*) can determine both the rising and falling output delays for the NOR gate 211. Also indicated is a non-controlling rise input delay 316 between the time $I_{or\_nc}$ rises and when $O_{or\_nc}$ falls (see, e.g., the left half of FIG. 3A(*b*)). It is envisioned that the rise delay 316 be selected such that it is sufficiently longer than the output falling delay 318. Otherwise, if the $O_{or\_nc}$ signal rises prior to the output 216 falling, the falling output delay for the output 216 may not be accurately determined.

It is envisioned that no logic gate be used in design of the AND_NC and OR_NC devices, in part, because logic gates generally have a finite delay through them. Based on the I/O characteristics of these devices (as illustrated in FIGS. 3A(b) and 3B(b)), it is desirable that the output signal be substantially similar to the input signal for at least one of the edges (i.e., without any finite delay). For example, FIG. 3A(b) illustrates that $I_{and\_nc}$ and $O_{and\_nc}$ have a substantially simultaneous rise. And, FIG. 3B(b) illustrates that $I_{or\_nc}$ and $O_{or\_nc}$ have a substantially simultaneous fall. Additionally, it is desirable that the input signal for the AND_NC and OR_NC devices have a substantially logic high or logic low for the other edge. It is, however, envisioned that the output signals of these devices, e.g., $O_{and\_nc}$ and $O_{or\_nc}$, may have a fall or rise delay associated with the other edge as illustrated in FIGS. 3A(b) and 3B(b), respectively. It is also envisioned that the delay associated with the non-controlling input of the gate being tested be sufficiently long enough to allow measurement of the rising or falling output delays accurately.

In an embodiment, AND_NC and OR_NC devices can be designed using several voltage controlled voltage sources (VCVS). It is also envisioned that these devices can be created utilizing operational amplifiers (including an operational transconductance amplifier (OTA)) configured to represent a VCVS such as PSpice model for the 741 op-amp. Other examples include current controlled current sources (CCCS), voltage controlled current sources (VCCC), current controlled voltage sources (CCVS), and the like.

Figure 4:
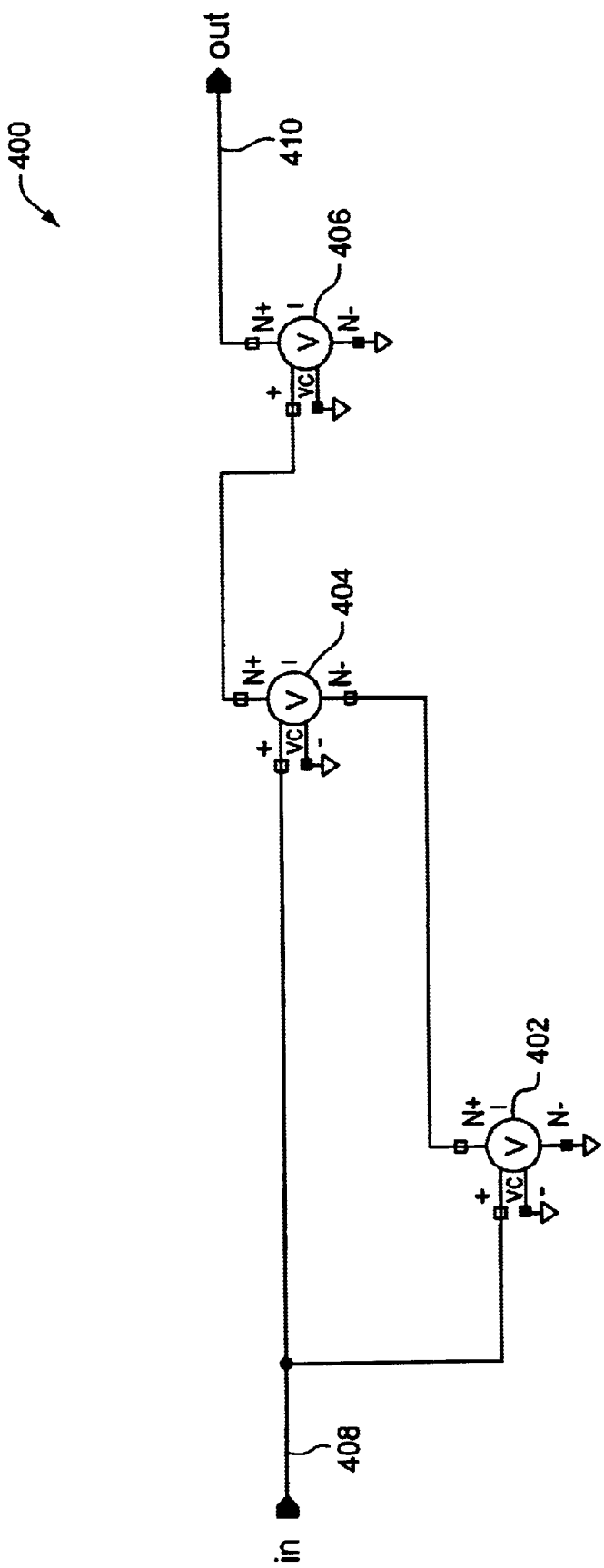
FIG. 4 illustrates an exemplary schematic for an AND_NC gate in accordance with an embodiment of the present invention.
Figure 5:
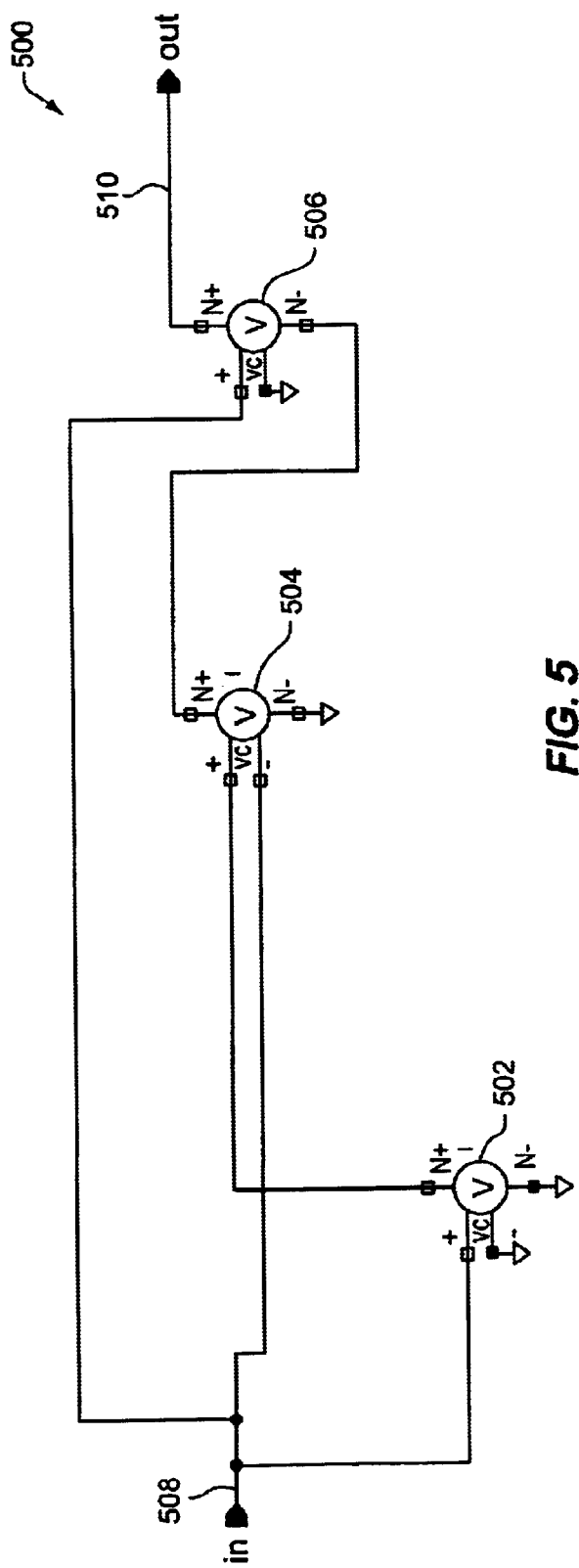
FIG. 5 illustrates an exemplary OR_NC schematic in accordance with an embodiment of the present invention.

FIGS. 4 and 5 illustrate exemplary VCVS devices in accordance with various embodiments of the present invention. FIG. 4 illustrates an exemplary schematic for an AND_NC gate in accordance with an embodiment of the present invention. FIG. 5 illustrates an exemplary OR_NC schematic in accordance with an embodiment of the present invention.

FIG. 4 illustrates a system 400 which includes three VCVS devices 402, 404, and 406. As illustrated, each VCVS has positive and negative element (output) nodes marked as N+ and N−, respectively. Each VCVS also has positive and negative controlling nodes VC+ and VC−, respectively. All VC− nodes are grounded in FIG. 4. The N− node of both VCVS 402 and 406 are also grounded. An input 408 of the system 400 is provided to the VC+ nodes of VCVS 402 and VCVS 404. The N+ node of VCVS 402 is provided to N− node of VCVS 404 and the N+ node of VCVS 404 is provided to VC+ node of VCVS 406. The N+ node of VCVS 406 provides an output 410 of the system 400. In some embodiments, it is envisioned that the voltage gain for all the VCVSes may be 1 (i.e., unity). It is further envisioned that the connection between different terminals may create the output waveforms. In some embodiments employing HSpice, the HSpice delay time for the device 402 may be set to the "fall delay" (such as the fall delay 306 discussed with respect to FIG. 3). It is also envisioned that for the device 406 Vmax may be set to Vdd and Vmin may be set to Vss in certain embodiments.

FIG. 5 illustrates a system 500 which includes three VCVS devices 502, 504, and 506. As with FIG. 4, each VCVS has positive and negative element (output) nodes marked as N+ and N−, respectively. Each VCVS also has positive and negative controlling nodes VC+ and VC−, respectively. As illustrated, two of the VC− nodes are grounded in FIG. 5 (for devices 502 and 506). The N− node of both VCVS 502 and 504 are also grounded. An input 508 of the system 500 is provided to the VC+ nodes of VCVS 502 and VCVS 504. The input 508 is additionally provided to the VC− node of VCVS 504. The N+ node of VCVS 502 is provided to VC+ node of VCVS 504 and the N+ node of VCVS 504 is provided to N− node of VCVS 506. The N+ node of VCVS 506 provides an output 510 of the system 500.

In some embodiments employing HSpice, the HSpice delay time for the device 502 may be set to the "rise delay" (such as the rise delay 316 discussed with respect to FIG. 3). It is also envisioned that for the device 506 Vmax may be set to Vdd and Vmin may be set to Vss in certain embodiments. Additionally, it is envisioned that for the device 504 the Vmaz may be set to zero in some embodiments.

Those with ordinary skill in the art would readily recognize that the use of these devices can be extended to more complex gates than just NAND or NOR gates. For example, an AND type gate would work similar to the NAND gate configuration described herein. Moreover, an OR type gate would work similar to the NOR gate configuration described herein. Even for gates like and-or-invert (AOI), combination of both the devices can be utilized to simulate the falling and rising delays through the gates in one schematic. An example of how these devices can be used with AOI gate is shown in FIG. 6.

Figure 6:
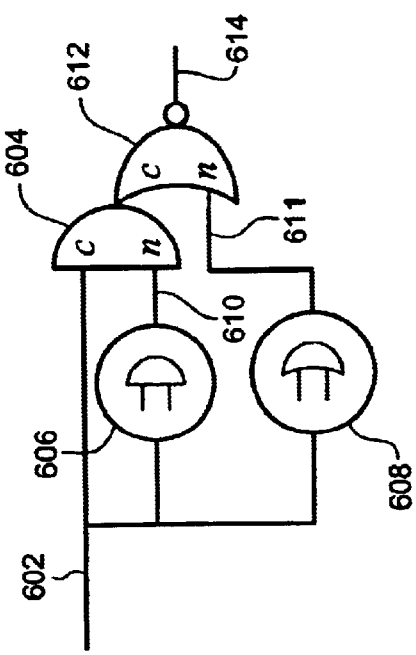
FIG. 6 illustrates an exemplary system 600 in accordance with an embodiment of the present invention.

In FIG. 6, a system 600 includes an AND gate 604, an AND_NC device 606, an OR_NC device 608, and a NOR gate 612. An input 602 of system 600 provides signals to a controlling input of the AND gate 604, an input of the AND_NC device 606, and an input of an OR_NC device 608. In some embodiments, the AND_NC 606 and OR_NC 608 devices can be similar to or exactly the same as any respective devices discussed herein. An output 610 of the AND_NC device 606 is provided to the non-controlling input of the AND gate 604. An output 611 of the OR_NC device 608 is provided to the non-controlling input of the NOR gate 612. A controlling input of the NOR gate 612 receives its input from the AND gate 604. An output 614 of the NOR gate 612 provides the output of the system 600.

The foregoing description has been directed to specific embodiments. It will be apparent to those with ordinary skill in the art that modifications may be made to the described embodiments, with the attainment of all or some of the advantages. For example, AND_NC devices can be used for NAND or AND gates and OR_NC devices can be used for NOR or OR gates. Also, while behavior of signals herein may be described by utilizing verbs such as "falls" or "rises," this description is fully intended to be interchangeable where a signal starting to fall or starting to rise may be a triggering event. Therefore, it is the object of the appended claims to cover all such variations and modifications as come within the spirit and scope of the invention.

What is claimed is:

1. An apparatus for efficiently performing critical path analysis, the apparatus comprising:
   an input node coupled to a controlling input of a gate;
   an output node coupled to a non-controlling input of the gate; and
   a device coupled between the input and output nodes, the device having an I/O characteristic wherein:
      signals at both the input and output nodes rise and fall substantially simultaneously on a first edge; and
      on a remaining edge, a signal at the output node follows one of a rise and a fall of a signal at the input node after an output node delay,
   wherein the apparatus provides both rising and falling delays for the critical path analysis of the gate.

2. The apparatus of claim 1 wherein the input node has one of a substantially logic low state and a substantially logic high state during a portion of the output node delay.

3. The apparatus of claim 2 wherein the portion of the output node delay is substantially larger than at least one of an output rising delay and an output falling delay of the gate.

4. The apparatus of claim 1 wherein the signals at both the input and output nodes rise and fall on the first edge without any finite delay.

5. The apparatus of claim 1 wherein the output node delay is sufficiently long enough to allow measurement of both rising and falling delays for the critical path analysis of the gate.

6. The apparatus of claim 1 wherein the device includes at least three VCVS devices coupled between the input and output nodes.

7. The apparatus of claim 6 wherein each VCVS includes:
a positive controlling node (VC+);
a negative controlling node (VC−);
a positive element node (N+); and
a negative element node (N−).

8. The apparatus of claim 7 wherein a plurality of negative controlling nodes (VC−) is grounded.

9. The apparatus of claim 7 wherein at least two of the negative element nodes (N−) are grounded.

10. The apparatus of claim 7 wherein the input node is coupled to at least two of the positive controlling nodes (VC+).

11. The apparatus of claim 7 wherein a positive element node (N+) of a first VCVS is provided to a negative element node (N−) of a second VCVS.

12. The apparatus of claim 11 wherein a positive element node (N+) of the second VCVS is coupled to the output node.

13. The apparatus of claim 7 wherein a positive element node (N+) of a first VCVS is provided to a positive controlling node (VC+) of a second VCVS.

14. The apparatus of claim 13 wherein a positive element node (N+) of the second VCVS is coupled to the output node.

15. The apparatus of claim 7 wherein the input node is coupled to at least one of the negative controlling nodes (VC−).

16. The apparatus of claim 1 wherein the gate is one selected from a list comprising AND, NAND, OR, NOR, and AOI gates.

17. The apparatus of claim 1 wherein the first edge may occur after the remaining edge.

18. The apparatus of claim 1 wherein the first edge may occur prior to the remaining edge.

19. A method of efficiently performing critical path analysis, the method comprising:
providing a device to assist in determining both rising and falling delays for the critical path analysis of a gate;
coupling an input of the device to a controlling input of the gate;
coupling an output of the device to a non-controlling input of the gate, the device having an I/O characteristic wherein:
signals at both the input and output of the device rise and fall substantially simultaneously on a first edge; and
on a remaining edge, a signal at the device output follows one of a rise and a fall of a signal at the device input after a output node delay; and
determining the rising and falling delays for the critical path analysis of the gate utilizing the device.

20. The method of claim 19 wherein the device input has one of a substantially logic low state and a substantially logic high state during a portion of the output node delay.

21. The method of claim 20 wherein the portion of the output node delay is substantially larger than at least one of an output rising delay and an output falling delay of the gate.

22. The method of claim 19 wherein the signals at both the device input and output rise and fall on the first edge without any finite delay.

23. The method of claim 19 wherein the output node delay is sufficiently long enough to allow measurement of both rising and falling delays for the critical path analysis of the gate.

24. The method of claim 19 further including providing at least three VCVS devices to implement the device.

25. The method of claim 24 wherein each of the VCVS devices include:
a positive controlling node (VC+);
a negative controlling node (VC−);
a positive element node (N+); and
a negative element node (N−).

26. The method of claim 25 wherein the output of the device is provided by a positive element node (N+) of one the VCVS devices.

27. The method of claim 25 wherein the input of the device is provided to at least two positive controlling nodes (VC+).

28. The method of claim 19 wherein the first edge may occur after the remaining edge.

29. The method of claim 19 wherein the first edge may occur prior to the remaining edge.

30. A machine-readable medium that provides instructions which, when executed by a machine, cause the machine to perform operations comprising:
providing a device to assist in determining both rising and falling delays for the critical path analysis of a gate;
coupling an input of the device to a controlling input of the gate; and
coupling an output of the device to a non-controlling input of the gate, the device having an I/O characteristic wherein:
signals at both the input and output of the device rise and fall substantially simultaneously on a first edge; and
on a remaining edge, a signal at the device output follows one of a rise and a fall of a signal at the device input after a output node delay.

31. The medium of claim 30 wherein the machine utilizes an operating system selected from a group comprising Solaris, Windows NT, Windows 2000, Windows XP, Windows ME, HP-UX, Unix, BSD Unix, Linux, and AUX.

32. An apparatus comprising:
delay measurement means to provide both rising and falling delays for a critical path analysis of a gate;
first coupling means to couple an input of the delay measurement means to a controlling input of the gate;
second coupling means to couple an output of the delay measurement means to a non-controlling input of the gate;
isolating means to logically isolate the delay measurement means output from the delay measurement means input; and
determining means for determining the rising and falling delays for the critical path analysis of the gate.

33. The apparatus of claim 32 wherein the delay measurement means includes at least three VCVS devices.

* * * * *